United States Patent
Lee et al.

(10) Patent No.: US 7,052,999 B2
(45) Date of Patent: May 30, 2006

(54) METHOD FOR FABRICATING SEMICONDUCTOR DEVICE

(75) Inventors: Sung-Kwon Lee, Ichon-shi (KR); Sang-Ik Kim, Ichon-shi (KR); Jun-Hyeub Sun, Ichon-shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 299 days.

(21) Appl. No.: 10/617,226

(22) Filed: Jul. 11, 2003

(65) Prior Publication Data

US 2004/0127052 A1  Jul. 1, 2004

(30) Foreign Application Priority Data

Dec. 26, 2002  (KR) .................. 10-2002-0084234

(51) Int. Cl.
*H01L 21/302*  (2006.01)

(52) U.S. Cl. .................. 438/706; 438/634; 438/672; 438/720

(58) Field of Classification Search .......... 438/624, 438/629, 634, 631, 672, 706, 710, 714, 720

See application file for complete search history.

(56) References Cited

U.S. PATENT DOCUMENTS

| | | | | |
|---|---|---|---|---|
| 6,074,959 A | * | 6/2000 | Wang et al. | 438/738 |
| 6,183,655 B1 | * | 2/2001 | Wang et al. | 216/68 |
| 6,277,727 B1 | * | 8/2001 | Kuo et al. | 438/618 |
| 6,287,957 B1 | * | 9/2001 | Linliu | 438/634 |
| 6,448,179 B1 | * | 9/2002 | Kim et al. | 438/672 |

FOREIGN PATENT DOCUMENTS

JP       03-248537       11/1991

* cited by examiner

*Primary Examiner*—Lan Vinh
(74) *Attorney, Agent, or Firm*—Mayer, Brown, Rowe & Maw LLP

(57) ABSTRACT

The present invention provides a method for fabricating a semiconductor device capable of decreasing a parasitic capacitance to thereby increase a cell capacitance. To achieve this effect, the deposited third inter-layer insulation layer is planarized and is subjected to a wet etching process to make its height lower than that of the bit line. Afterwards, the nitride-based etch stop layer is formed on the etched third inter-layer insulation layer, and then, the contact hole for forming the storage node contact plug is formed in between the bit lines through the SAC process so that the etch stop layer does not remain at sidewalls of the bit line. From this structure, it is possible to decrease the parasitic capacitance, and this decrease further provides an effect of increasing the cell capacitance.

15 Claims, 5 Drawing Sheets

METHOD FOR FABRICATING SEMICONDUCTOR DEVICE

FIELD OF THE INVENTION

Figure 1A:
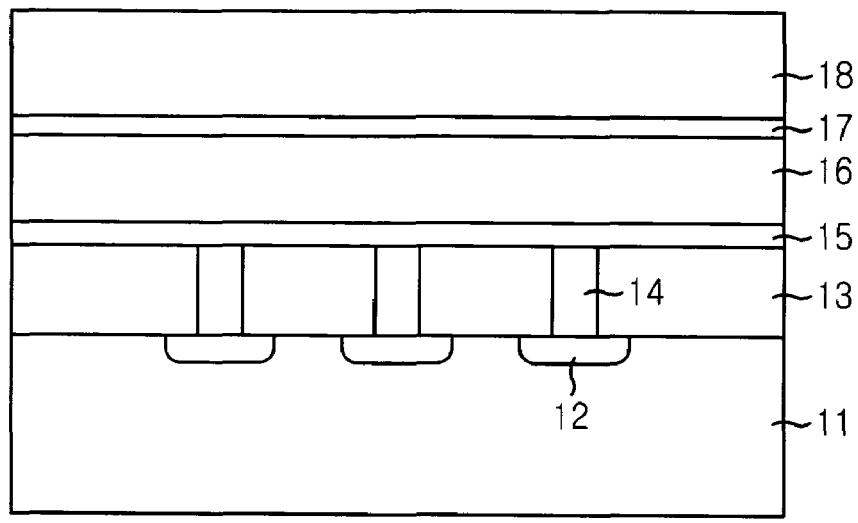

The present invention relates to a semiconductor device; and, more particularly, to a method for fabricating a semiconductor device capable of reducing a parasitic capacitance of a semiconductor memory cell.

DESCRIPTION OF RELATED ARTS

Hereinafter, there is provided descriptions on problems arose by using a conventional method for fabricating a semiconductor device with reference to an exemplified process for forming a storage node contact hole.

FIGS. 1A to 1D are cross-sectional views showing a conventional process for forming a storage node contact hole.

As shown, an inter-layer insulation layer 13 is deposited on a substrate 11 providing various elements such as a word line (not shown), an impurity contact region 12 and so forth, and then, the inter-layer insulation layer 13 is selectively etched to form contact holes exposing the impurity contact region 12. Herein, the inter-layer insulation layer 13 is called a word line insulation layer.

Next, a plurality of plugs 14 for a storage node contact or a bit line contact are formed. Each plug 14 is buried into each contact hole, and thereby being contacted to the exposed impurity contact region 12.

It is common to use polysilicon for the plug 14; however, it is recently a frequent case that a stack structure including a tungsten layer and a barrier metal layer such as Ti/TiN generally used as a diffusion barrier layer is used for the plug 14 instead of the polysilicon.

Subsequent to the plug 14 formation, a diffusion barrier layer 15 having the typical structure of Ti/TiN is formed on the entire substrate structure. The diffusion barrier layer 15 is for suppressing a source gas used for depositing a subsequent metal layer 16 for a bit line (hereinafter referred to as a bit line metal layer) from reacting with the plug 14 and the impurity contact region 12. Then, on top of the diffusion barrier layer 15, the bit line metal layer 16 is formed by using polysilicon, tungsten or metal alloys such as tungsten nitride, tungsten silicide and so forth.

Next, such material as undoped silicate glass (USG) is used to form a buffer layer 17. The buffer layer 17 is for reducing stress easily generated between the bit line metal layer 16 and a nitride layer 18 commonly used as a hard mask. Herein, a process for forming the buffer layer 17 is omitted.

The nitride layer 18 for a hard mask (hereinafter referred to as a hard mask nitride layer) is typically made of nitride-based materials such as polysilicon nitride or silicon nitride.

Figure 1B:
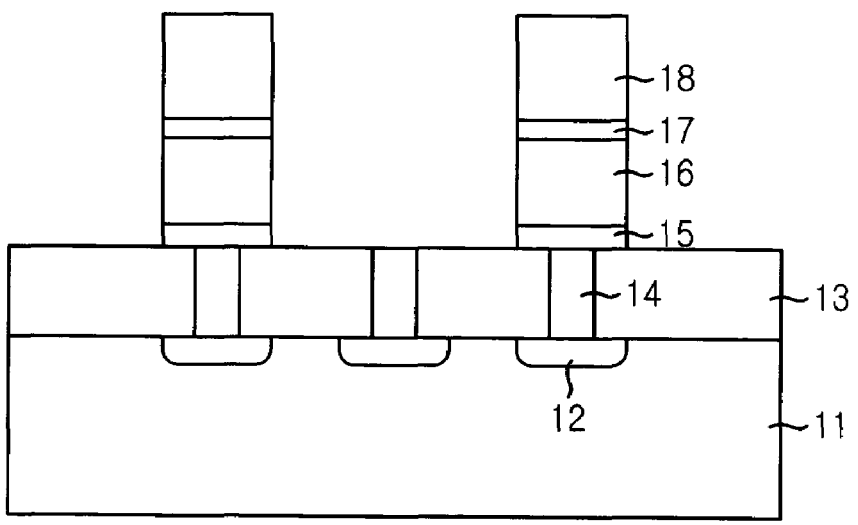
Figure 1C:
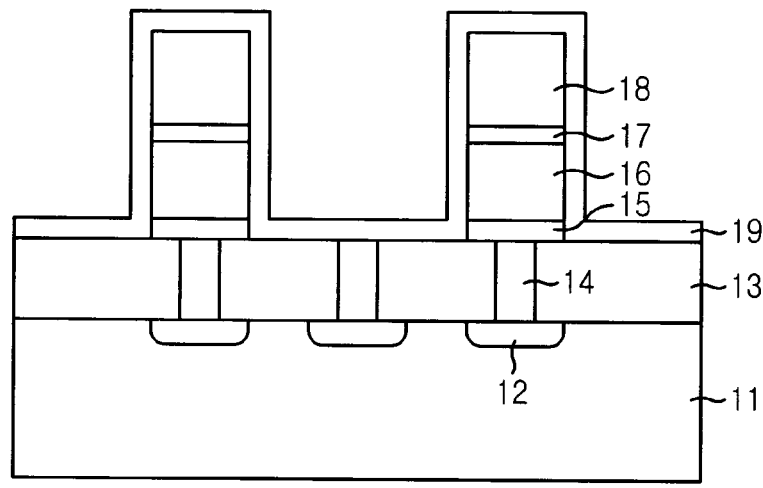

Referring to FIG. 1B, the hard mask nitride layer 18, the buffer layer 17, the bit line metal layer 16 and the diffusion barrier layer 15 are selectively etched to form a bit line with use of a hard mask for a bit line (hereinafter referred to as a bit line hard mask).

The higher level of integration in a semiconductor device makes it difficult to stably secure overlay accuracy and a process margin of a pattern formation with use of a photoresist. Therefore, a self-aligned contact (SAC) process is employed since it uses pre-deposited existing materials without using an additional hard mask during the formation of the pattern, e.g., a contact hole. As a result, the SAC process is capable of reducing the fabrication costs. Among various etching methods of the SAC process, a nitride layer is typically used as an etch stop layer. Therefore, the SAC process etches an insulation layer under a condition that a nitride layer encompasses sidewalls and an upper part of a conductive pattern such as a gate electrode or a bit line and an oxide layer is subsequently etched in a higher rate than the nitride layer.

The SAC process is also employed for a storage node contact formation. Thus, a nitride-based etch stop layer 19 is deposited along the upper part and sidewalls of the bit line in order to prevent a bit line loss during the SAC process.

Figure 1D:
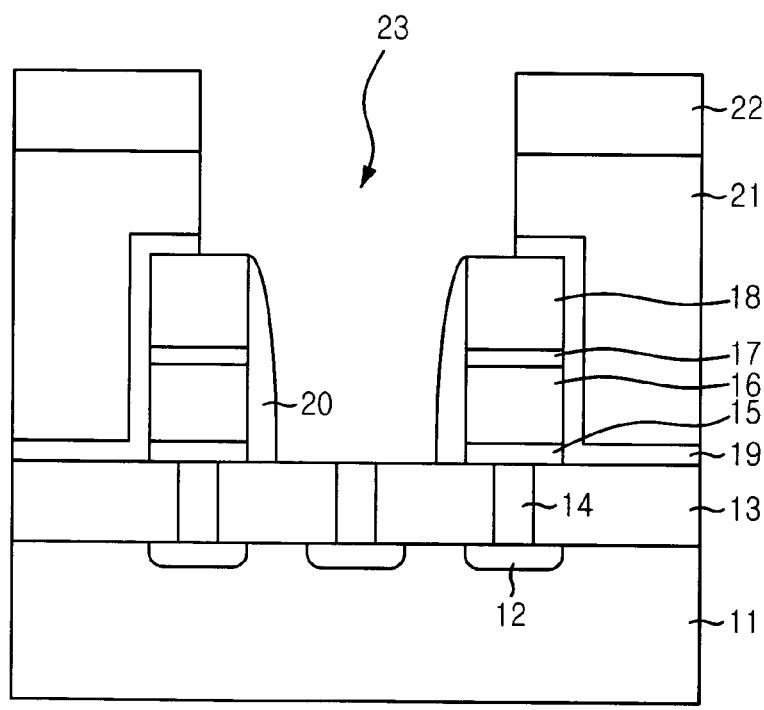

As shown in FIG. 1D, another inter-layer insulation layer 21, which is called a bit line insulation layer, is formed on the above structure including the etch stop layer 19. At this time, the bit line insulation layer 21 is typically made of USG formed at a low temperature.

Next, the bit line insulation layer 21 is planarized by performing a chemical mechanical polishing (CMP) process with a target that the bit line insulation layer 21 remains with a predetermined thickness on top of the hard mask nitride layer 18. A photoresist pattern 22 for forming a storage contact is formed thereafter. The bit line insulation layer 21 and the etch stop layer 19 are sequentially etched with use of the photoresist pattern 22 as an etch mask. This etch process is the SAC etch process. From this SAC etch process, a contact hole 23 exposing a surface of the plug 14 allocated between the bit lines is formed.

Prior to forming the contact hole 23, a typical process for forming a contact pad is additionally performed to improve an overlap margin of a process for forming the contact. However, in this section, detailed descriptions on this process are omitted.

After the SAC process, the nitride-based etch stop layer 19 is etched so that a spacer 20 is formed at a sidewall of each bit line.

Meanwhile, a silicon nitride layer, which is the most common nitride layer, has a dielectric constant of about 7.5. This value is higher than that of a silicon oxide layer, which is the most common oxide layer. As a reference, the dielectric constant of the silicon oxide layer is about 3.9.

When this plug structure formed by the SAC process is applied to a capacitor contact hole formation in a dynamic random access memory device, that is, the capacitor contact hole is formed by etching a space between the bit lines through the SAC process, a bit line capacitance is increased compared to the typical contact structure that a bit line and a capacitor contact plug, which is fundamentally a charge storage electrode, are insulated with an oxide layer such as silicon oxide. This increased bit line capacitance means an increase of a parasitic capacitance, which, in turn, decreases a cell capacitance.

Accordingly, it is necessary to develop a process for securing a stable SAC etch profile as simultaneously as for minimizing the decrease of the cell capacitance.

SUMMARY OF THE INVENTION

It is, therefore, an object of the present invention to provide a method for fabricating a semiconductor device capable of decreasing a parasitic capacitance to thereby increase a cell capacitance.

In accordance with an aspect of the present invention, there is provided a method for fabricating a semiconductor device, including the steps of: (a) forming a plurality of conductive patterns arranged with a predetermined spacing distance on a substrate, each conductive pattern including a conductive layer and a hard mask nitride layer; (b) forming a planarized inter-layer insulation layer on an entire surface of the resulting structure from the step (a); (c) etching the inter-layer insulation layer through the use of a wet etching process or a dry etching process so that a height of the inter-layer insulation layer is lower than that of the hard mask nitride layer; (d) forming an etch stop layer along the inter-layer insulation layer; (e) forming a self-aligned contact hole of which partial portion expands towards each conductive pattern by etching selectively the etch stop layer and the inter-layer insulation layer until a surface of a partial portion of the substrate disposed within the predetermined spacing distance is exposed and; and (f) forming a self-aligned contact structure by filling the self-aligned contact hole with a conductive material.

BRIEF DESCRIPTION OF THE DRAWING(S)

The above and other objects and features of the present invention will become apparent from the following description of the preferred embodiments given in conjunction with the accompanying drawings, in which:

FIGS. 1A to 1D are cross-sectional views showing a conventional process for forming a storage node contact hole; and FIGS. 2A to 2F are cross-sectional views showing a process for forming a storage node contact plug in accordance with a preferred embodiment of the present invention.

DETAILED DESCRIPTION OF THE INVENTION

Hereinafter, with reference to FIGS. 2A to 2F, there are provided descriptions on a method for fabricating a semiconductor device including a storage node contact plug capable of decreasing a parasitic capacitance to thereby increase a cell capacitance.

Figure 2A:
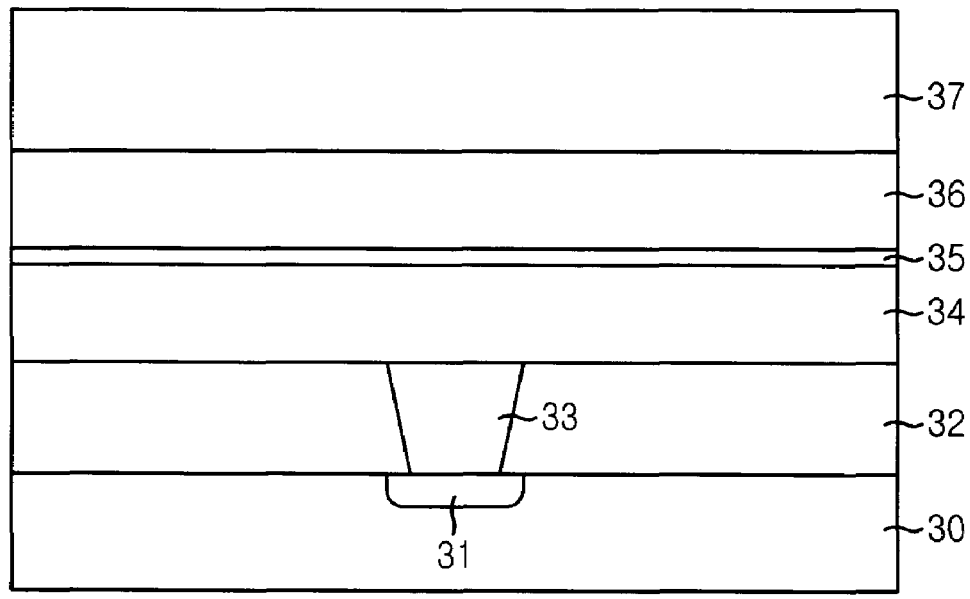

Referring to FIG. 2A, a first inter-layer insulation layer 32 for a word line is formed on a substrate 30 providing various elements of a semiconductor device such as a word line (not shown), an impurity contact region 31 and so forth. The first inter-layer insulation layer 32 is also called a word line insulation layer. Then, the first inter-layer insulation layer 32 is selectively etched to form a contact hole (not shown) exposing the impurity contact region 31.

Next, a plug 33 for making a contact to a storage node or a bit line is formed by filling the contact hole. Concurrently, the plug 33 is also contacted to the exposed impurity contact region 31. Herein, the plug 33 includes the typical landing plug contact (LPC) contacted to the impurity contact region 31 of the substrate 30.

The plug 33 is generally made of polysilicon. Recently, a structure including multiple layers of a tungsten layer and a barrier metal layer using Ti/TiN is frequently used instead of the polysilicon.

Subsequent to the plug 33 formation, a process for forming a contact pad on the plug 33 is then performed; however, detailed descriptions on this process is omitted for the sake of convenience. Herein, a second inter-layer insulation layer 34 is deposited on the entire resulting structure including the plug 33.

A diffusion barrier layer 35 having the typical structure of Ti/TiN is formed on the second inter-layer insulation layer 34. The diffusion barrier layer 35 is for suppressing a source gas used for forming a metal layer 36 for a bit line (hereinafter referred to as a bit line metal layer) from reacting with the plug 33 and the impurity contact region 31. Then, the bit line metal layer 36 is formed with such metal as tungsten, polysilicon and so forth or metal alloys such as tungsten nitride, tungsten silicide and so forth.

After the bit line metal layer 36 formation, a nitride layer 37 for a hard mask (hereinafter referred to as a hard mask nitride layer) is deposited through a plasma enhanced chemical vapor deposition (PECVD) technique or a low pressure chemical vapor deposition (LPCVD) technique. The hard mask nitride layer 37 includes the typical nitride-based materials such as silicon oxynitride or silicon nitride. In this preferred embodiment of the present invention, the hard mask nitride layer 37 has a thickness ranging from about 1000 Å to about 5000 Å.

Meanwhile, it is also possible to perform an additional process for forming a buffer layer (not shown) for reducing stress easily generated between the bit line metal layer 36 and the hard mask nitride layer 37. At this time, the buffer layer is made of undoped silicate glass (USG).

Figure 2B:
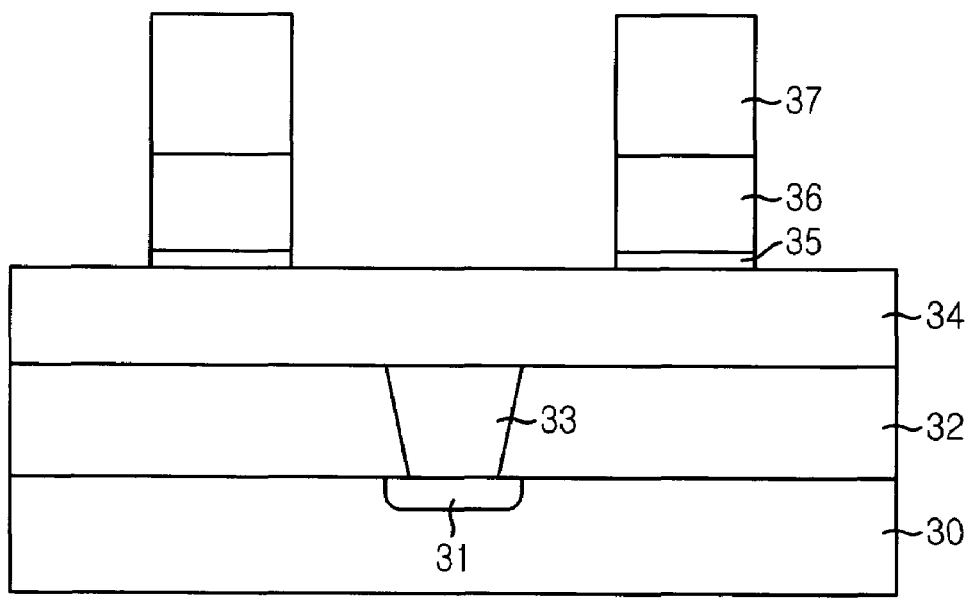
Figure 2C:
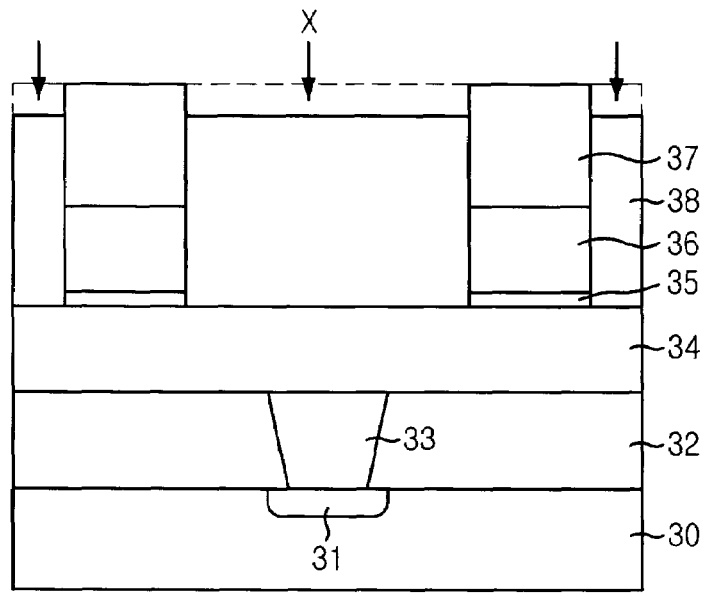

As shown in FIG. 2B, the hard mask nitride layer 37, the bit line metal layer 36 and the diffusion barrier layer 35 are selectively etched with use of a bit line hard mask so that a bit line having a stack structure of the hard mask nitride layer 37, the bit line metal layer 36 and the diffusion barrier layer 35 is formed.

A third inter-layer insulation layer 38 is deposited on the above structure including the bit line. The third inter-layer insulation layer 38 is called a bit line insulation layer. At this time, the third inter-layer insulation layer 38 is formed with any material selected from a group consisting of a boron-phosphorus silicate glass (BPSG) layer, a high temperature oxide (HTO) layer, a medium temperature oxide (MTO) layer, a high density plasma (HDP) oxide layer, a tetra-ethyl-ortho silicate (TEOS) layer or an advanced planarization layer (APL).

Next, a chemical mechanical polishing (CMP) process is performed with a target that the third inter-layer insulation layer 38 has the same height of the hard mask nitride layer 37 so as to make the third inter-layer insulation layer 38 planarized. Then, a wet etching process is performed by using a wet solution such as buffered oxide etchant (BOE) or HF. After the wet etching process, the height of the third inter-layer insulation layer 38 is lower than that of the hard mask nitride layer 37. This etched thickness is remarked as 'X' in FIG. 2C.

It is also noted that a dry etching process can be performed instead of the wet etching process. Furthermore, the third inter-layer insulation layer 38 is etched to a depth in a range from about 300 Å to about 1500 Å from an upper part of the hard mask nitride layer 37.

Figure 2D:
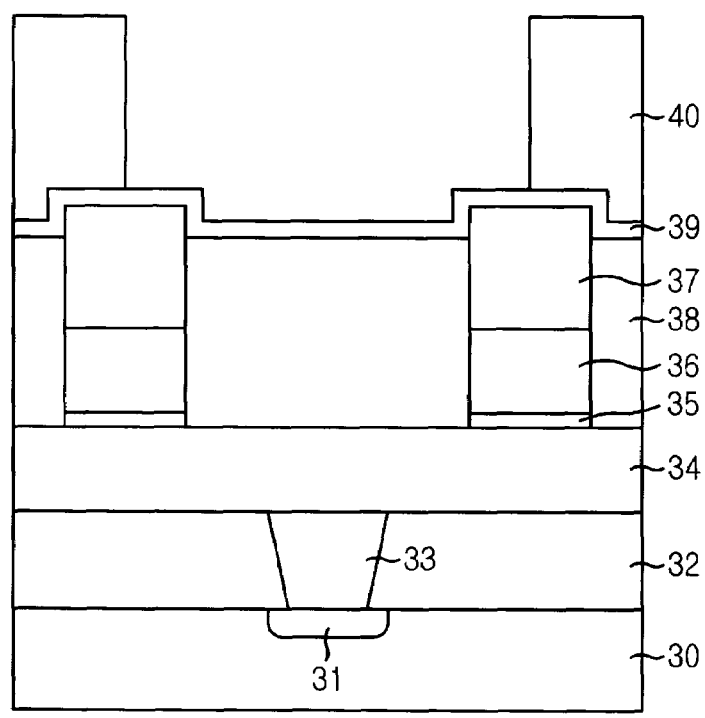

With reference to FIG. 2D, a self-aligned contact (SAC) process is employed for forming a storage node contact. Thus, a nitride-based etch stop layer 39 is deposited along the etched third inter-layer insulation layer 38 and an upper part of the bit line in order to prevent a bit line loss due to the SAC process and provide a different etch selectivity from the oxide-based third inter-layer insulation layer 38.

A photoresist pattern 40 for a storage node contact (hereinafter referred to as a storage node contact photoresist pattern) is formed on the etch stop layer 39. At this time, the photoresist pattern is formed by employing a photo-exposure process using a light source of KrF or ArF. Also, the etch stop layer 39 is formed with a nitride-based material such as silicon nitride or silicon oxynitride. Also, the thickness of the etch stop layer 39 is preferably in a range from about 50 Å to about 1000 Å.

Figure 2E:
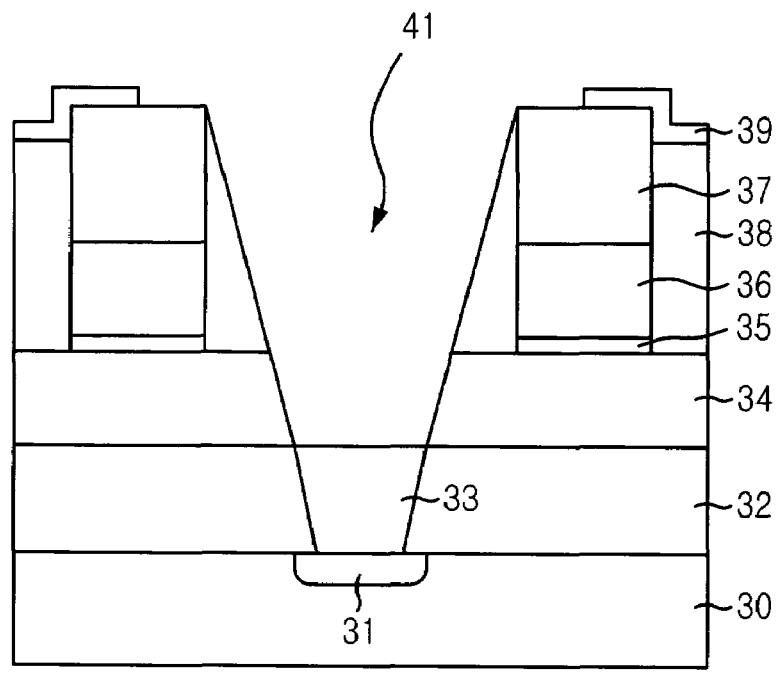

Referring to FIG. 2E, the etch stop layer 39, the third inter-layer insulation layer 38 and the first inter-layer insulation layer 34 are sequentially etched through the SAC process. At this time, the storage node contact photoresist pattern 40 is used as an etch mask. It is also noted that the etch mask for forming the storage node contact hole is formed in a hole-type, T-type or a line-type. From this SAC process, a contact hole 41 exposing a surface of the plug 33 allocated between the bit lines is formed.

In addition, during the SAC process, such gas as $C_3F_8$, $C_4F_8$, $C_5F_8$, $C_3F_3$, $C_4F_6$ or $C_2F_4$ is used as a main etch gas to provide high etch selectivity during the SAC process. Also, such gas as $CHF_3$, $C_2HF5$, $CH_2F_2$ or $CH_3F$ can be also used as the etch gas for increasing a bottom side area of the storage node contact hole in order to improve reliability of the etch process along with the high etch selectivity. Additionally, oxygen gas or Ar gas can be also used as the etch gas for improving a stopping function of the etch process by increasing plasma stability and sputtering efficiency.

In contrary to the prior art wherein the SAC process is employed to form a spacer at a sidewall of the contact hole by etching the nitride-based etch stop layer, there is no spacer formed in accordance with the present invention.

Therefore, it is important to properly control the thickness and apply etch recipe based on a concerned design rule in order to secure an intended etch profile and simultaneously to block the etch stop layer 39 from remaining at the sidewalls of the contact hole 41.

Meanwhile, prior to forming the contact hole, a process for forming a contact pad can be additionally performed to improve an overlap margin of a contact formation process. However, detailed descriptions on this additional process are omitted.

Figure 2F:
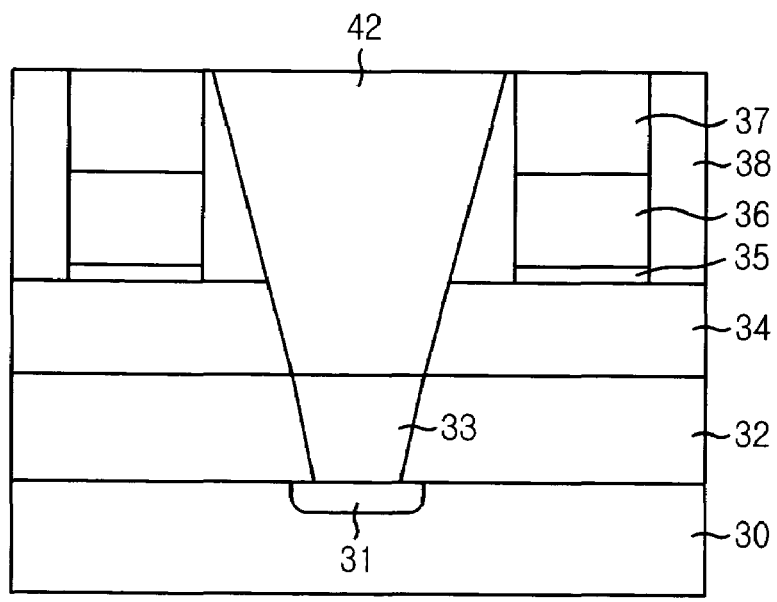

A conductive material for a storage node contact (SNC) plug 42 (hereinafter referred to as a SNC plug conductive material) is deposited into the contact hole 41. The remaining etch stop layer 39 and the SNC plug conductive material are removed through a CMP process under an etch target of exposing a surface of the third inter-layer insulation layer 38 so to form the planarized and isolated SNC plug 42. As shown in FIG. 2F, the SNC plug 42 is formed between the bit lines and is connected to a bottom part of the plug 33.

In the mean time, the oxide-based bit line insulation layer 38, i.e., the third inter-layer insulation layer, exists in between the SNC plug 42 and the bit line. Particularly, the oxide-based third inter-layer insulation layer has a lower dielectric constant than the nitride-based material used in the prior art. Therefore, a loading capacitance of the parasitic capacitor, constructed by the SNC plug 42, the bit line and the third inter-layer insulation layer 38, is decreased. This decreased loading capacitance provides a further effect of augmenting an overall cell capacitance.

In addition to the above-described preferred embodiment for forming the storage node contact plug with use of the SAC process, the present invention can be still applicable to various types of semiconductor device fabrication processes for which the SAC process is employed. A process for opening an active region between the gate electrodes is one example of applying the present invention to other processes.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, the method comprising:
   (a) forming a plurality of conductive patterns arranged with a predetermined spacing distance on a substrate;
   (b) forming a planarized inter-layer insulation layer on an entire surface of the resulting structure from the step (a);
   (c) etching the inter-layer insulation layer through the use of a wet etching process or a dry etching process to thereby expose a whole upper portion of the conductive patterns;
   (d) forming an etch stop layer on an entire surface of a resulting structure from the step (c);
   (e) etching the etch stop layer and the inter-layer insulation layer until a surface of a partial portion of the substrate disposed within the predetermined spacing distance is exposed to thereby form a self-aligned contact hole; and
   (f) forming a self-aligned contact structure by filling the self-aligned contact hole with a conductive material.

2. The method as recited in claim 1, wherein the etch stop layer is a nitride-based layer and has a thickness ranging from about 50 Å to about 1000 Å.

3. The method as recited in claim 2, wherein the inter-layer insulation layer is an oxide-based layer.

4. The method as recited in claim 1, wherein the self-aligned contact hole is formed with use of a photoresist pattern formed by employing a photo-exposure process using a light source of KrF or ArF.

5. The method as recited in claim 4, wherein a mask for forming the storage node contact hole is formed in a hole-type, T-type or a line-type.

6. The method as recited in claim 1, wherein the storage node contact hole is formed by a self-aligned contact (SAC) process.

7. The method as recited in claim 6, wherein such gas as $C_3F_8$, $C_4F_8$, $C_5F_8$, $C_3F_3$, $C_4F_6$ or $C_2F_4$ is used as a main etch gas to provide high etch selectivity during the SAC process.

8. The method as recited in claim 6, wherein during the SAC process, such gas as $CHF_3$, $C_2HF_5$, $CH_2F_2$ or $CH_3F$ is also used as the etch gas for increasing a bottom side area of the storage node contact hole in order to improve reliability of the etch process along with the high etch selectivity.

9. The method as recited in claim 6, wherein during the SAC process, oxygen gas or Ar gas is also used as the etch gas for improving a stopping function of the etch process by increasing plasma stability and sputtering efficiency.

10. The method as recited in claim 1, wherein each conductive pattern includes a conductive layer and a hard mask nitride layer.

11. The method as recited in claim 10, wherein the hard mask nitride layer has a thickness in a range from about 1000 Å to about 5000 Å.

12. The method as recited in claim 11, wherein at the step of etching the inter-layer insulation layer, the inter-layer insulation layer is etched from an upper part of the hard mask nitride layer until reaching a thickness in a range from about 300 Å to about 1500 Å.

13. The method as recited in claim 12, wherein the inter-layer insulation layer is made of any material selected from the group consisting of a boron-phosphorus silicate glass (BPSG), high temperature oxide (HTO), medium temperature oxide (MTO), high density plasma (HDP) oxide, tetra-ethyl-ortho silicate (TEOS) and advanced planarization layer (APL).

14. The method as recited in claim 10, wherein the conductive layer is a bit line and the conductive material is a storage node contact plug.

15. The method as recited in claim 1, wherein a partial portion of the self-aligned contact hole expands towards each conductive pattern.

* * * * *